United States Patent [19]

Domogalla

[11] Patent Number: 4,665,326
[45] Date of Patent: May 12, 1987

[54] VOLTAGE COMPARATOR

[75] Inventor: John C. Domogalla, Missouri City, Tex.

[73] Assignee: Texas Instruments, Inc., Dallas, Tex.

[21] Appl. No.: 816,676

[22] Filed: Jan. 3, 1986

Related U.S. Application Data

[63] Continuation of Ser. No. 317,715, Nov. 3, 1981, abandoned, and a continuation of Ser. No. 594,154, Mar. 28, 1984, abandoned.

[51] Int. Cl.[4] .......................... H03K 5/24; H03K 5/153
[52] U.S. Cl. .................................... 307/362; 307/491; 307/530
[58] Field of Search ............... 307/491, 494, 355, 350, 307/530, 362; 330/252, 253, 255, 310

[56] References Cited

U.S. PATENT DOCUMENTS 4,048,574  9/1977  Barbier et al. ..................... 330/253
4,375,039  2/1983  Yamauchi ........................... 307/530

OTHER PUBLICATIONS

P. R. Gray et al., "All-MOS Analog-Digital Conversion Techniques", IEEE Trans. on Circuits and Systems, vol. CAS-25, No. 7, Jul. 1978, pp. 482-489.
B. M. Gordon, "Linear Electronic Analog/Digital Conversion Architectures, Their Origins, Parameters, Limitations, and Applications", IEEE Trans, on Circuits and Systems, vol. CAS-25, No. 7, Jul. 1978, pp. 391-418.
J. L. McCleary et al., "All-MOS Charge Redistribution Analog-to-Digital Conversion Techniques-Part 1", IEEE Journal of Solid-State Circuits, vol. SC-10, No. 6, Dec. 1975, pp. 371-379.
Z. G. Boyacigiller et al., "An Error-Correcting 14b/20 MS CMOS A/D Converter", 1981, IEEE International Solid-State Circuits Conf. Digest of Technical Papers, Feb. 18, 1981, pp. 62-63.
B. Fotouhi et al., "An NMOS 12b Monotonic 25 MS A/D Converter", 1979 IEEE ISSCC Digest of Technical Papers Feb. 15, 1979, pp. 186-187.

Primary Examiner—John Zazworsky
Attorney, Agent, or Firm—Richard K. Robinson; Robert D. Marshall, Jr.; Rodney M. Anderson

[57] ABSTRACT

A voltage comparator for an analog to digital converter is provided which includes several differential amplifier stages connected in cascade that determine the existence of a voltage difference between the two input signals and amplify this voltage difference successively. The comparator further includes offset correction voltage circuits which are connected to each differential amplifier stage and allow for the correction of errors caused by the mismatching of the devices internal to each of the differntial amplifier stages.

2 Claims, 3 Drawing Figures

VOLTAGE COMPARATOR

BACKGROUND OF THE INVENTION

1. Field of the Invention

This is a continuation of U.S. patent application Ser. No. 317,715 filed Nov. 3, 1981, now abandoned, and a continuation of U.S. patent application Ser. No. 594,154, filed Mar. 28, 1984, now abandoned.

This invention relates to data acquisition for digital systems and more specifically to analog to digital data conversion.

2. Description of Prior Art

Of all interfaces between different types of systems, the most important and most difficult is usually a link between the analog and digital sections of the system. The interface between digital circuits and analog circuits includes a digital-analog converter or D/A converter. Likewise the interface between the analog circuits and the digital circuits includes an A/D converter. An ideal A/D converter changes an analog signal into a digital signal without delay and without error. Of course, such ideal converters are not available. However, A/D converters with some delay and limited accuracy are available and are priced according to their accuracy and speed. The techniques used for A/D and D/A conversions are many. One paper that includes a thorough description of many A/D and D/A conversion techniques is an article by Bernard Gordon in the *IEEE Transaction of Circuit Systems*, CAS-25, July 1978, entitled "Linear Electronic Analog/Digital Conversion Architectures, Their Origins, Parameters, Limitations, and Applications." An additional paper in the same publication also describes MOS analog to digital devices. This paper is entitled "ALL-MOS Analog-Digital Conversion Techniques" by Paul R. Gray and David G. Hodges in the IEEE Transactions on Circuits and Systems, Volume CAS-25, July 7, 1978. This paper specifically describes the technique that is used in this invention under the heading of integrated circuit successive approximation converters. This technique includes charge redistribution which is described in Paul R. Gray's previous paper entitled "All-MOS Charge Redistribution Analog-to-Digital Conversion Techniques Part I" by James L. McCreary and Paul R. Gray, published in the IEEE Journal of Solid State Circuits, Volume SC-10, Dec. 6, 1975 in which charge redistribution is discussed using a bank of weighted capacitors.

Problems arise with the use of weighted capacitors because fabrication accuracy does not assure the accuracy needed for application. In the past, capacitors have been trimmed in an attempt to adjust them to obtain satisfactory accuracy. One technique that includes resistors and capacitors to obtain a higher resolution is disclosed in the paper, "An INMOS 12b Monotonic 25 microsecond A/D converter by Bahram Fotouhi and David A. Hodges presented at the 1979 *IEEE International Solid States Circuits Conference*, page 186. The technique disclosed shows the use of a resistor bank to effectively adjust the charge on capacitors. Another error correcting technique is disclosed in a paper entitled "An Error Correcting 14 Bit 20 Microsecond CMOS A/D Converter" by Ziya G. Boyacigiller, Basil Weir and Peter D. Bradshaw. Presented at the 1981 IEEE International Solid State Circuits Conference, this technique includes an error correcting circuitry that uses a redundant D/A with a successive approximation register.

SUMMARY OF THE INVENTION

In accordance with the present invention, a comparator is provided which includes dual inputs to several differential amplifier stages connected in cascade which determine the existence of a voltage difference between the two input signals. In addition, the differential amplifier stages provide amplification of any voltage difference. Several offset correction voltage circuits are connected in cascade with each other and each connected to one of the differential amplifier stages to provide offset correction to each differential amplifier. The correction is required due to the error generated from the mismatching of devices internal to the differential amplifiers.

BRIEF DESCRIPTION OF THE DRAWINGS

The novel features believed characteristic of this invention are set forth in the appended claims; however, this invention can be best understood by referencing the detailed description of the embodiment together with these drawings.

DESCRIPTION OF THE INVENTION

Figure 1:
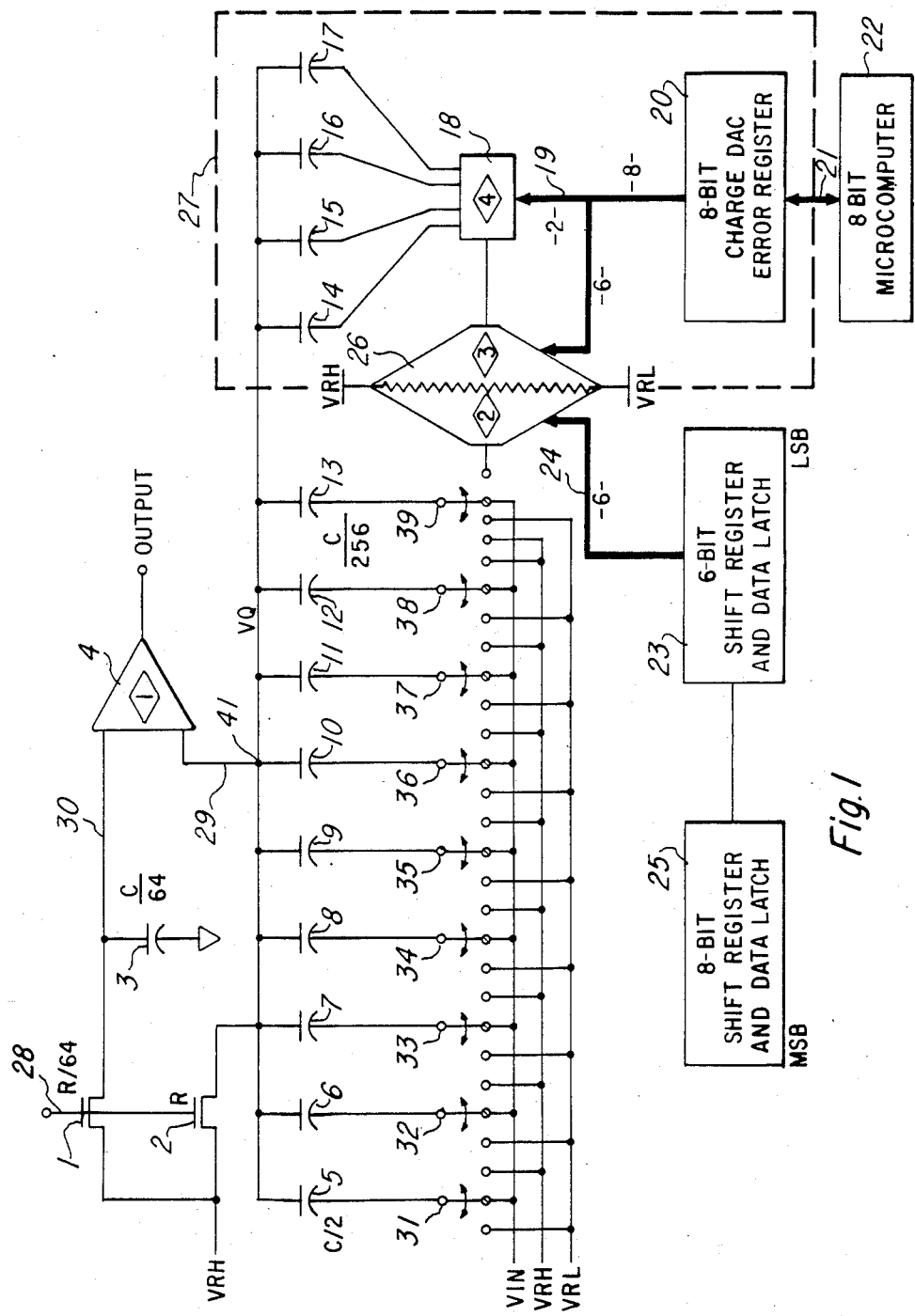
FIG. 1 is a schematic diagram of the analog to digital converter together with its interface to the microcomputer.

A diagram of the voltage to digital signal converter is illustrated in FIG. 1. The inputs to the converter are VIN (voltage input), VRH (high voltage reference) and VRL (low voltage reference). The digital output of the converter illustrated in FIG. 1 is a fourteen-bit digital signal. VRH and VRL as reference voltages define the range of the voltage input to be digitally quantitized, e.g., if $VIN \geq VRH$, the converter output is hex 3 FFF (all fourteen bits being "1"); if $VIN=(VRH-VRL)/2$, the converter output is hex 2000 (the most significant bit being "1" and the thirteen other bits being "0"); and if $VIN \leq VRL$, the converter output is hex 0000 (all fourteen bits being "0"). The converter uses a charge redistribution technique for quantitizing the voltage input VIN. This converter includes an array of eight capacitors 5 through 12 and a resistor array 26 connected to a second least significant bit capacitor 13 (i.e., a capacitor that is equal in capacitance to the least significant bit capacitance of the capacitor array). The resistor array capacitor combination permits an additional six bits of resolution, eight bits of resolution being provided by the capacitor array. For a tutorial discussion of the redistribution technique, the reader is directed to "All-MOS Analog-Digital Conversion Techniques" by Paul R. Gray and David A. Hodges, published in the IEEE Transactions on Circuits and Systems, Vol. CAS-25, No. 7, July 1978 and "All-MOS Charge Redistribution Analog-to-Digital Conversion Techniques-Part I" by James L. McCreary and Paul R. Gray published in the IEEE Journal of Solid-State Circuits, Vol. SC-10, No. 6, December 1975, both herein incorporated by reference. The circuit in FIG. 1 includes error circuit 27 which in combination with an 8 bit microcomputer 22 connected thereto via lines 21 provides for correction of capacitor stored charge in the capacitor array, i.e., provided that the weights of the capacitors (or capacitor values) are exactly binary fractions. In other words, according to the redistribution technique, if the total capacitance of the array is $C_T$ then capacitor 5 is a value $C_T/2$, capacitor 6 is a value $C_T/4$, capacitor 7 is a value $C_T/8$ and so forth. The error circuit 27 and microcomputer 22 when connected to comparator 4's output provide the capability to determine the weight error of each capacitor in the array and the value of correction required to correct each capacitor's weight.

To accomplish the correction, each capacitor transition is weighted one at a time. First, the line VQ is set to VRH by turning on MOSFET switch devices 1 and 2 by applying a voltage to line 28. Switches 1 and 2 are then open allowing line VQ to float (effectively set at VRH). Capacitor 12 is then set to "1", i.e., switch 38 for capacitor 12 is set to VRH. Meanwhile, switches 31 through 37 are set to VRL. Switch 39 is set to VRL. VQ is then reset to VRH via switch 2 as before. Capacitor 12 is set to VRL. The output from the comparator 4 is used to generate a correction factor for capacitor 12 and this factor is stored in the error register 20. Capacitor 13 is set to VRH via switch 39. If the capacitors were equal in size as they are supposed to be, the point VQ would not change from VRH.

However, any deviation of VQ from VRH will be evident from the output of the comparator 4 which is comparing VQ via line 29 to VRH via line 30.

Note that the error correction circuitry is initialized at this point to a zero correction factor to allow for the full voltage difference caused by the error in capacitor 12 to be present on line VQ. The error correction hardware 27 under control of the microcomputer 22 implements a binary search algorithm which provides voltage changes to VQ by charging capacitors 14 through 17 from the resistor array 26 and error circuit decoding hardware 18. This is accomplished by having the microcomputer load an 8 bit word into the error register 20. The most significant six bits are tapped onto the resistor array 26 and provide charge to VQ via capacitor 13 through switch 39. The least significant two bits are decoded by the error decoding hardware 18 to provide charge on the capacitors 14 through 17. When the correct charge is added (or subtracted) from VQ the output of comparator 4 is nulled or zero. The resulting error word is stored as the correction factor for that specific capacitor. After capacitor 12 has been corrected, capacitor 11 is corrected using both capacitor 12 and 13. Capacitors 12 and 13 in parallel sum to the supposed value of capacitor 11. The correction factor for capacitor 12 is used. Capacitor 11 is set to VRH and capacitors 12 and 13 are set to VRL. Then VQ is reset to VRH as before. The error register 20 is reset to zero since the charge correction has already been stored for capacitors 12 and 13. Capacitors 12 and 13 are then set to VRH and capacitor 11 is set to VRL. The difference of VQ from VRH is the error which is nulled by the microcomputer 22 using the binary search algorithm, using error correction factors for all eight capacitors in the array. This completes the error acquisition phase.

Two sources of error exist in the present configuration as shown. This error correction factor only accounts for one source, i.e. the individual capacitor weighing error. Another source of error results from the voltage charge of node 41 during the conversion sequence. Both sources are accounted for by computing the error conversion correction factor which is:

$C_t/2^i - Ce^i$ where $C_t$ = is the total of all error correction factors $i$ = is the power of weight for the individual capacitor (where MSB = 1, MSB + 1 = 2; "LSB = 8)

$Ce^i$ = is the individual error correction factor for that capacitor.

The error conversion correction factor is computed in the microcomputer 22.

The converter is now ready to digitize an analog input voltage supplied on line VIN. There are three stages in conversion: sample, setup and redistribution. During the sample stage VQ is set to VRH as previously discussed. All bottom plates of capacitors 5 through 13 are connected to VIN via switches 31 through 39, respectively. During the setup stage the comparator 4 is cleared, switches 1 and 2 are sequenced off and then all capacitors 5 through 13 are switched to VRH. The voltage of node 41 during this initialization is VRH + VRH − VIN. During the redistribution stage, the error value for capacitor 5 will be loaded into the error register 20 and the capacitor switch 31 will connect the capacitor 5 to VRL. The decision is made by the comparator as to whether voltage at node 41 is less than the reference (if so, bit=1) or greater or equal to the reference (if so, bit=0). If the bit is 1, then the capacitor remains connected to VRL; if not, then the capacitor is reconnected to VRH as prescribed the redistribution technique. If the capacitor 5 is connected to VRH, then the error conversion correction factor is removed from the error register. If the capacitor 5 is connected to VRL, then its error conversion correction factor is summed with the error conversion correction factor for the next capacitor 6 and placed in the error register 20. The same process before is repeated as prescribed by the charge redistribution technique. Note that since capacitor bit values equal to 1 will have their respective error conversion correction factors removed from the error register 20, at the end of the charge redistribution sequence the sum in the error register 20 will be:

$$\frac{C_T}{\Sigma B^{-i}(2^i - C_{Ei})}$$

where,

B is the bit value $C_T$ is the total of error correction factors i is the individual capacitor weight position (where the MSB = 1 and the LSB = 8)

$C_{Ei}$ is the individual capacitor error correction factor

Also in FIG. 1, the size of switch 1 and its connected capacitance 3 are scaled in relation to switch 2 with the capacitor array. This is required as part of the solution to the accuracy problem caused by the voltage dependent capacitive coupling from the gate to the source/drain of MOS transistor switches. The switch 1 is large since since the capacitance of the capacitor array is large and the resistance of switch 1 must be low to allow a fast sample rate.

The charge injected from switches 1, 2 and capacitor array switches is a linear function of the change in gate voltage and a nonlinear function of source/drain potential of those switches. Or more generally, the decoupling voltage is a function of the reference input and the analog input. Since the analog input is unknown, then its effect must be negated. This is accomplished by the sequential closing of switches. Switch 2 is closed before any of the switches 31 through 39 are closed to allow the charge that results from the voltage VRH-VIN on the top plates of the capacitor array to be trapped. The decoupling voltage function from the reference input is effectively negated by the scaling of the Switch 1 and capacitor 3 to switch 2 and the array of capacitors 5 through 13. That is, if the capacitor 3 is 1/64th the capacitance of the array of capacitors 5 through 13, the switch 1 is fabricated to have a gate to drain capacitance of 1/64th that of switch 2. This is accomplished by the selecting the sizes of the two switches. The decoupling voltage is then differentially applied to the comparator 4 and negated through the common mode rejection of the comparator when switches 31 through 39 are closed to VRH.

Note that during both the error acquisition/correction phase and the conversion phase that the resistor array 26 and capacitor 13 is used. This is possible since the resistor array 26 has 64 taps dedicated to the conversion phase by connecting via line 24 these taps to the six bit shift register 23 which contains the least significant six bits of the digitized voltage. Resistor array 26 has an additional 64 taps interspaced between the previously mentioned 64 taps. The second set of 64 taps are connected via lines 19 to the error register 20. Two additional bits of error register 20 are connected to the error decoder 18 as previously discussed. This configuration permits the single resistor array 26 to serve two separate functions: error acquisition/correction and conversion.

The difference of this converter architecture from the prior art exists in the capacitor/resistor structure. Previously the resistor array was used to determine the most significant bit positions and the capacitor array was used to determine the least significant bit positions. The advantage of the disclosed architecture is that reduced loading is placed on the resistor array which enhances conversion speed. A disadvantage to the disclosed architecture is the nonmonotonic behavior caused by the weighting errors in the capacitor array. This disadvantage is negated in the disclosed architecture by the error correction sequencing. An additional difference from prior art is that the resistor array 26 is fabricated using polysilicon interconnects rather than an N type diffusion. The use of polysilicon avoids the nonlinear behavior of N type diffusions resulting from voltage dependent conduction.

Figure 2A:
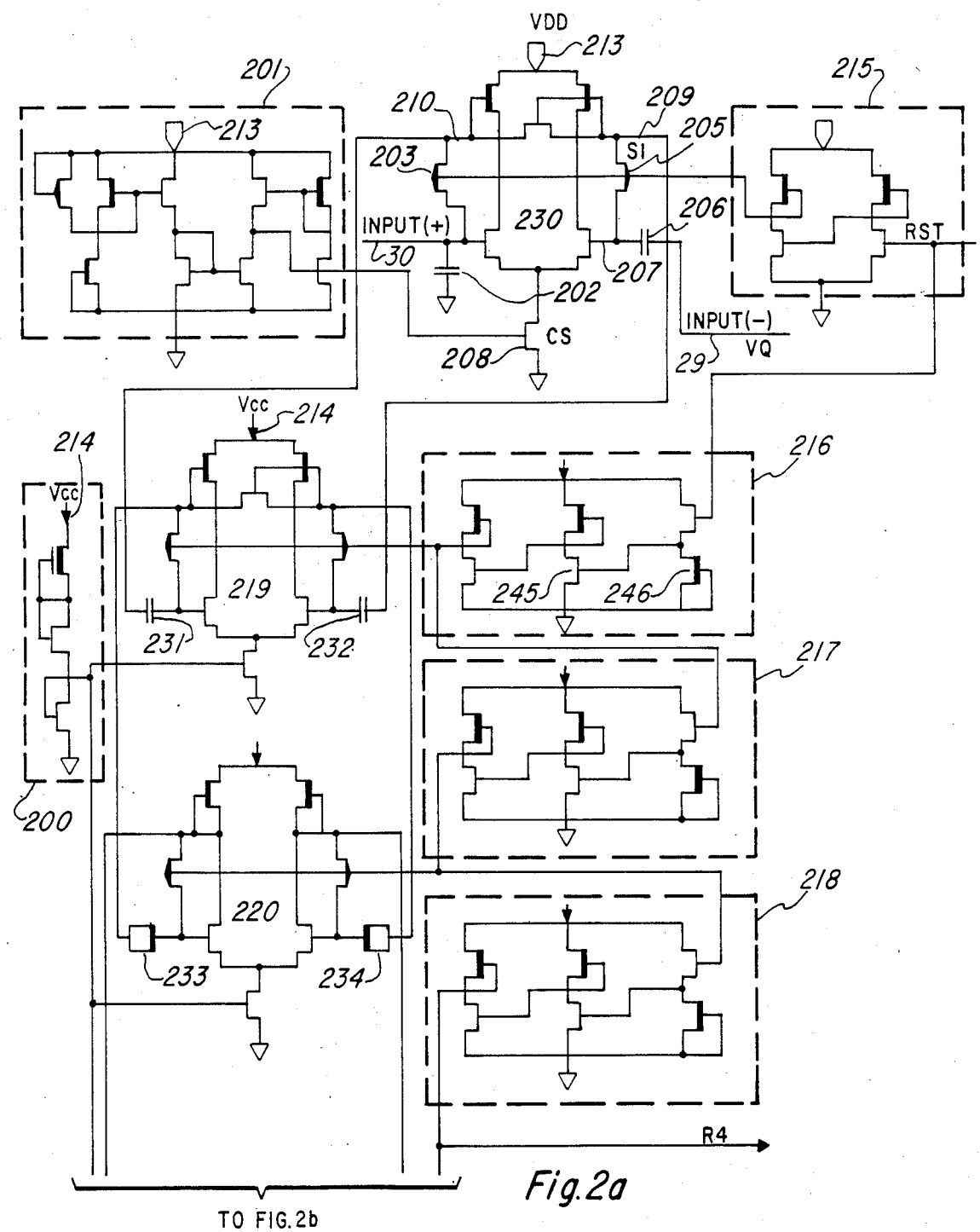
FIGS. 2a and 2b are a schematic diagram of the comparator.
Figure 2B:
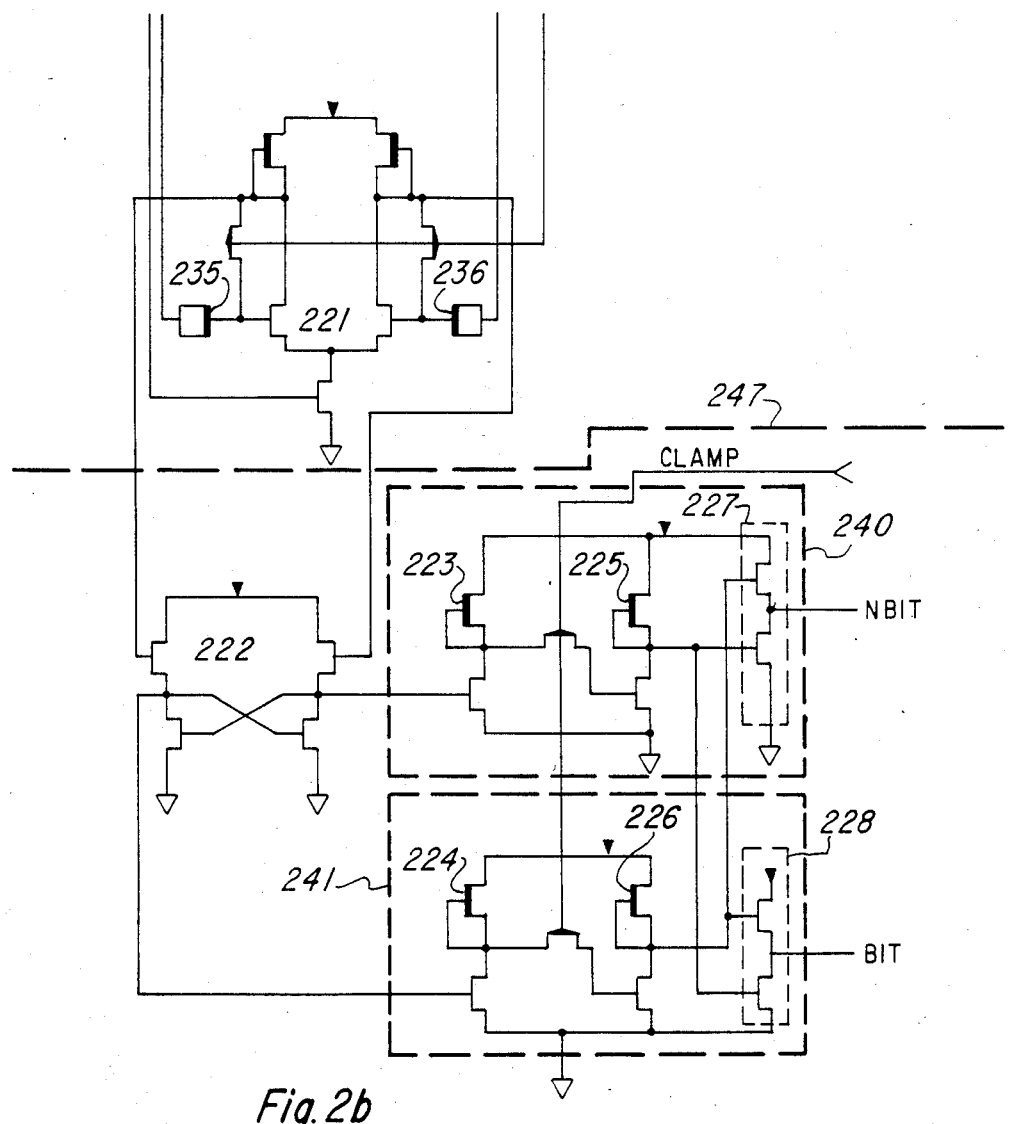

FIGS. 2a and 2b illustrate the comparator 4 as shown in FIG. 1. The comparator can be divided into two parts, the first above the line 247 is the preamplifier portion, the circuitry below line 247 is the power amplifier. The preamplifier section consists of four stages, 230, 219, 220, and 221. Each individual stage is a common source differential amplifier with two legs 210 and 209 as shown in stage 230. The structure provides for differential input with the output being a differential voltage gain with common mode rejection. The two inputs through to the comparator are placed on lines 30 and 29 through the offset voltage capacitors 202 and 206. The output is placed on legs 209 and 210. Circuitry 215 is provided to receive and isolate the comparator from the reset signal, RST, when the reset signal is received it turns switches 203 and 205 to an on state which effectively clamps the inputs to the outputs for that stage. This allows the signal placed on capacitors 206 and 202 to be transmitted through the output lines to the next stage which is in turn switched by circuitry 216. This process continues through the circuitry 217 and 218, allowing this signal voltage to be outputted from the comparator 4. The capacitors in the stages 230 and 219 are different in fabrication from the capacitors in stages 220 and 221, in that the capacitors 202, 206, 231 and 232 are metal polysilicon capacitors using a multilevel oxide as a dielectric whereas capacitors 233, 234, 235 and 236 are depleted MOSFET devices acting as capacitors.

An offset voltage results from the current mismatch existing between the legs such as 210 and 209. While the scaling of the two switches 1 and 2 as shown in FIG. 1 are equivalent, some small offset voltage still remains. By allowing signals to be transmitted through the comparator 4 through capacitors 202, 206, 231, 232, 233, 234, 235 and 236, the input reflected offset then is divided by the gain of all the differential amplifiers.

Note that the circuits 216, 217 and 218 actually act as delay circuits to allow the preceding stage to become operable and transmit its offset voltage to the next stage. Circuits 216, 217 and 218 act as delay circuits according to components 245 and 246 in 216 and the like components in circuits 217 and 218. Component 245 is an enhanced MOSFET device that acts as a capacitor while component 246 is a depleted MOSFET device which acts as a resistor. This resistor capacitor combination sets the time constant for these time delay circuits and allows for the offset voltage to be loaded across the differential amplifier stages in a sequential manner.

Another feature of the comparator is that it contains circuits for rejection of noise from the power supply. These two power supply biased current circuits are 201 and 200. The first stage is different from the second, third and fourth stages in that the bias circuit 201 and stage 230 are tied to Vdd through 213. Vdd can be anywhere from 5 to 15 volts. The Vdd power in circuit 201 is inputted into the common source device 208. The use of Vdd in the first stage reduces the probability of this first stage being overdriven and thus reducing the probability of the successive stages from being overdriven. In the second, third and fourth stage of the preamplifier section the power supply Vcc is marked as 214. The biased circuit 200 serves the same purpose as the biased circuit 201 except for the second power supply Vcc.

Circuitry 222 receives output from the fourth stage of the preamplifier and serves to reduce the bias level of the signal to a digital range for amplification. This cross coupled circuit serves to shift the voltage level of the comparator signal while maintaining its gain. The true and false signals which are outputted from circuitry 222 are amplified by circuits 240 and 241. The output NBIT and BIT from circuitry 240 and 241, respectively, is used to switch each capacitor 5 through 12 either in or out of the array as prescribed by the charge redistribution procedure. The output of 240 is NBIT, the output of 241 is BIT as marked. The circuitry in 240 and 241 are simply two inverter circuits separated by a switch under the control of the CLAMP signal as shown. The CLAMP signal merely turns off the output of the comparator during the reset mode of the converter, as previously discussed. After the signal from circuitry 222 is passed to circuitry 240 it passes through two inverters, 223 and 225 into a push-pull amplifier 227 for output on the NBIT line. Likewise the circuitry 241 contains the two inverters 224 and 226 and the push-pull circuitry 228. These inverters provide the last stage of amplification for the signals for the comparator.

This comparator is novel in that it allows for the use of power supplies at 5 volts or less. The use of the 5 volt power supply, though, requires that the noise rejection circuitry as previously discussed be included. Another novel feature of this comparator is that it provides effective 0 offset voltage by implementation of the previously discussed self-biasing procedure.

I claim:

1. A voltage comparator comprising:

an input for receiving a voltage to be compared against a reference voltage;

a plurality of differential amplifiers connected in cascade, each having a pair of differential input terminals and a pair of differential output terminals, the input terminals of the first of said plurality of differential amplifiers receiving said voltage comparator input and said reference voltage, the differential output terminals of each differential amplifier connected to the differential input terminals of the next cascade differential amplifier;

power amplifier means connected to the differential output terminals of the last cascade differential amplifier for separately amplifying the signals at said differential output terminals of said last cascade differential amplifier; and a plurality of reset isolation means, each having a reset input terminal and a reset output terminal, each reset output terminal connected to a corresponding one of said plurality of differential amplifiers for clamping the voltage at the differential output terminals of said corresponding differential amplifier upon receipt of a signal upon said reset input terminal, said plurality of reset isolation means connected in cascade with the reset input terminal of each reset isolation means connected to the reset output terminal of the reset isolation means corresponding to the previous differential amplifier, for providing a sequentially delayed reset to successive differential amplifiers.

2. A voltage comparator as claimed in claim 1, further including:

a first power supply bias means connected to a first voltage source for supplying a bias current to said first differential amplifier; and a second power supply bias means connected to a second voltage source for supplying a bias current to the rest of said differential amplifier.

* * * * *